United States Patent
Lin et al.

(10) Patent No.: US 9,814,158 B1
(45) Date of Patent: Nov. 7, 2017

(54) SERVER CHASSIS RAIL

(71) Applicant: Super Micro Computer Inc., San Jose, CA (US)

(72) Inventors: Ken-Sheng Lin, San Jose, CA (US); Shihhsing Chien, San Jose, CA (US); Richard S. Chen, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days.

(21) Appl. No.: 15/256,555

(22) Filed: Sep. 3, 2016

(51) Int. Cl.
  *H05K 7/20*  (2006.01)
  *H05K 7/18*  (2006.01)

(52) U.S. Cl.
  CPC ................................ *H05K 7/183* (2013.01)

(58) Field of Classification Search
  CPC .................................................. H05K 7/183
  See application file for complete search history.

(56) References Cited

U.S. PATENT DOCUMENTS

| | | | | |
|---|---|---|---|---|
| 5,403,097 | A * | 4/1995 | Woof | F16C 29/04 384/20 |
| 6,972,961 | B2 * | 12/2005 | Erskine | H05K 7/1425 361/727 |
| 7,976,112 | B2 * | 7/2011 | Stock | A47B 88/483 312/334.1 |
| 8,226,181 | B2 * | 7/2012 | Du | H05K 7/1489 211/26 |
| 8,251,466 | B2 * | 8/2012 | Stock | A47B 88/483 312/334.1 |
| 8,289,696 | B2 * | 10/2012 | Peng | G06F 1/187 361/679.39 |
| 2003/0002261 | A1 * | 1/2003 | Berry | H05K 7/1489 361/727 |
| 2004/0037046 | A1 * | 2/2004 | Dittus | H05K 7/1489 361/724 |
| 2007/0001562 | A1 * | 1/2007 | Park | A47B 88/467 312/333 |
| 2008/0124009 | A1 * | 5/2008 | Peng | A47B 88/57 384/21 |
| 2014/0111930 | A1 * | 4/2014 | Henderson | G06F 1/181 361/679.31 |
| 2014/0265790 | A1 * | 9/2014 | Hashemi | F16C 29/048 312/334.8 |
| 2015/0201754 | A1 * | 7/2015 | Chen | A47B 96/025 248/219.3 |
| 2015/0334868 | A1 * | 11/2015 | Fricker | H05K 7/1489 361/727 |

\* cited by examiner

*Primary Examiner* — Anthony Q Edwards
(74) *Attorney, Agent, or Firm* — Chun-Ming Shih; HDLS IPR Services

(57) ABSTRACT

A server chassis rail includes a guide plate. The guide plate is of a strip shape. Two sides of the guide plate have two troughs arranged opposite to each other in parallel and spaced apart relationship. Multiple plastic slide sleeves are disposed in the two opposing troughs, and each of the slide sleeves protrudes from an inner surface of the corresponding trough. Production costs are reduced by utilizing the plastic slide sleeves instead of rollers.

9 Claims, 8 Drawing Sheets

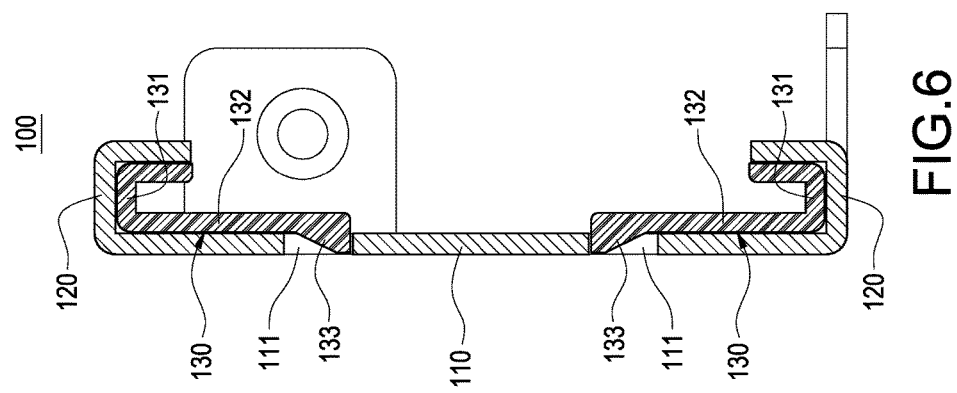

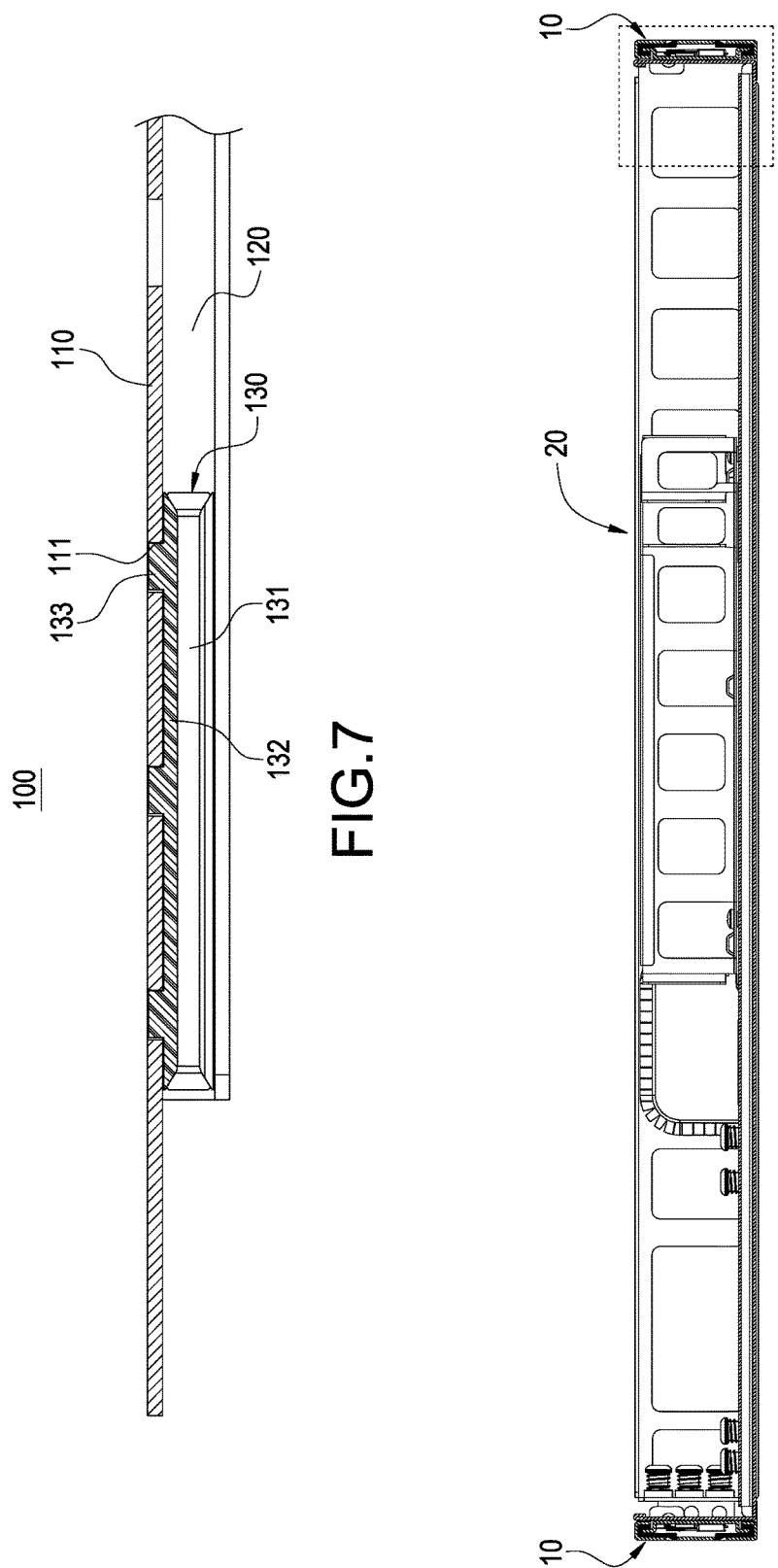

SERVER CHASSIS RAIL

TECHNICAL FIELD

The present invention relates to a slide rail and, in particular, to a server chassis rail.

BACKGROUND

The present server equipment normally includes server cabinets and multiple drawers superposed in the server cabinet. The drawer accommodates a host computer or hard disks. The drawer can be pulled out for maintenance. Since the drawer is heavy after being loaded with the hard disks, a slide rail is utilized between the drawer and an inner surface of the server cabinet to facilitate the drawer's movement. A common slide rail includes an inner rail and an outer rail engaged with each other, and the outer rail has rollers disposed inside for contacting the inner rail to thereby reduce a resistance force against relative movement between the inner rail and the outer rail. However, the rollers take up a certain space, leading to a large-size slide rail. Furthermore, the rollers are expensive, and it is not easy to assemble the rollers.

Accordingly, the inventor made various studies to solve the above-mentioned problems, on the basis of which the present invention is accomplished.

SUMMARY

The present invention provides a server chassis rail with an improved structure.

The present invention provides a server chassis rail which includes a guide rail. The guide plate is of a strip shape. Two sides of the guide plate are disposed with two troughs arranged opposite to each other in parallel and spaced apart relationship. Multiple slide sleeves, made of plastic, are disposed in the two troughs opposite to each other, and each of the slide sleeves protrudes from an inner surface of the corresponding trough.

According to the server chassis rail of the present invention, each of the slide sleeves includes an engagement latch, and the engagement latch is engaged with the guide plate.

According to the server chassis rail of the present invention, each of the slide sleeves forms a recess portion, and each of the recess portions is attached to an inner surface of the corresponding trough. Each of the slide sleeves includes a positioning plate extending from the recess portion. An engagement latch is formed on the positioning plate, and the engagement latch is engaged with the guide plate. The guide plate includes a fastening hole corresponding to the engagement latch, and the engagement latch is engaged in the fastening hole. The engagement latch is formed at a distal edge of the positioning plate. The slide sleeves in the two troughs are disposed in aligned and opposing relationship with respect to each other, and the engagement latch of each of the slide sleeves is aligned with the engagement latch of the aligned and opposing one of other slide sleeves.

The server chassis rail of the present invention further includes an inner rail, the inner rail is of a strip shape, a lateral edge of the inner rail is inserted in the at least one slide sleeve in one of the troughs, and the other lateral edge of the inner rail is inserted in the at least one slide sleeve in the other trough.

According to the server chassis rail of the present invention, a distance between the slide sleeve disposed on one end of each of the troughs and the adjacent slide sleeve is less than a distance between any adjacent two of other slide sleeves. Each of the troughs includes an outer end, the two outer ends of the two troughs are arranged opposite to each other, the inner rail passes through the two outer ends of the two troughs to move out, and a distance between the slide sleeve at the outer end and the adjacent slide sleeve is less than a distance between any adjacent two of other slide sleeves.

By utilizing the plastic slide sleeves, the inner rail can easily slide with respect to the outer rail, so there is no need for installing large-size and expensive rollers in the outer rail, thereby reducing costs and facilitating easy assembly.

BRIEF DESCRIPTION OF THE DRAWINGS

The disclosure will become more fully understood from the detailed description, and the drawings given herein below is for illustration only, and thus does not limit the disclosure, wherein:

FIG. 6 is a lateral cross-sectional view illustrating the outer rail in the server chassis rail according to the preferable embodiment of the present invention;

FIG. 7 is a longitudinal cross-sectional view illustrating the outer rail in the server chassis rail according to the preferable embodiment of the present invention;

FIG. 8 is a lateral cross-sectional view illustrating the server chassis rail according to the preferable embodiment of the present invention.

DETAILED DESCRIPTION

Figure 1:
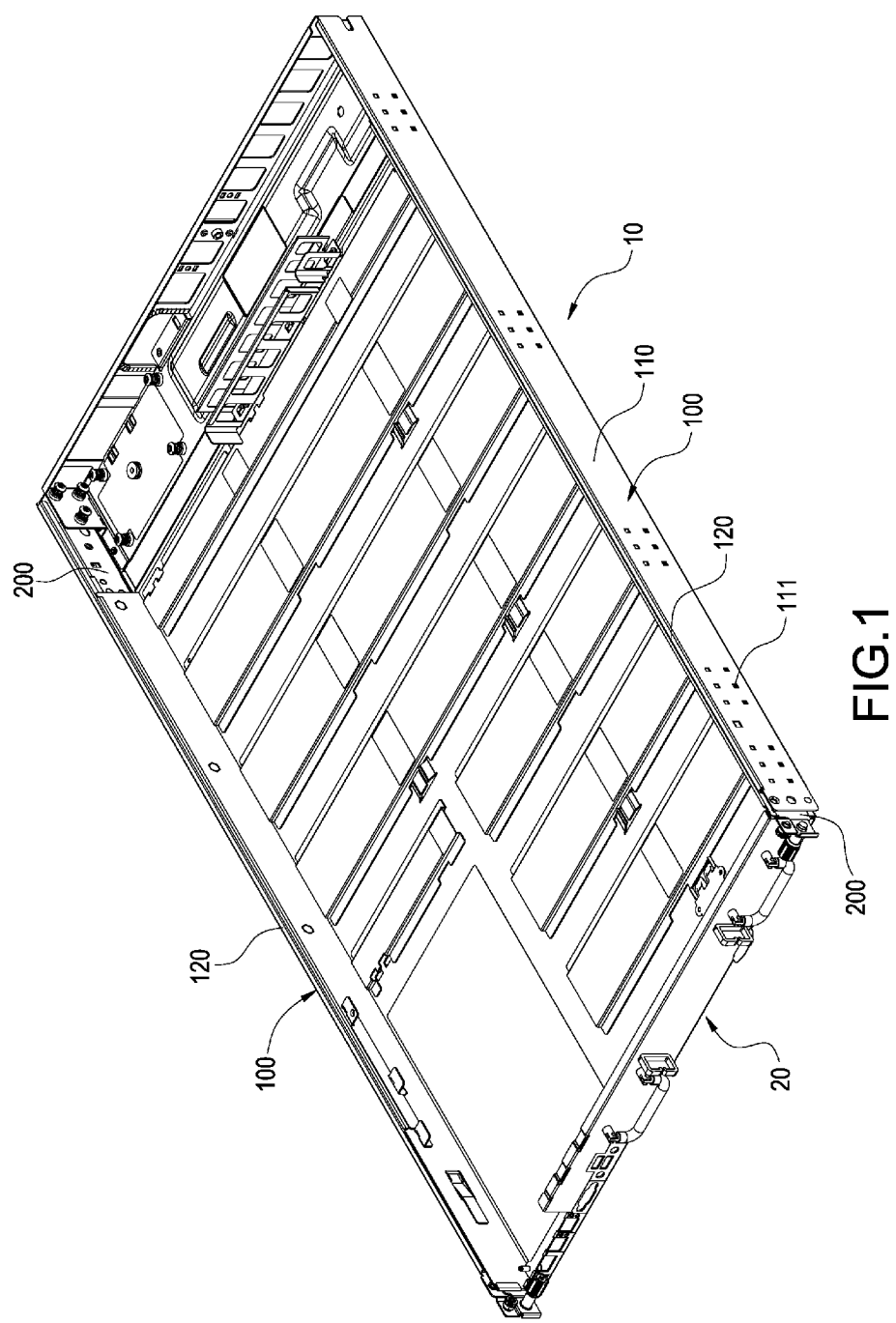
FIG. 1 is a perspective view illustrating a server chassis rail according to a preferable embodiment of the present invention.
Figure 2:
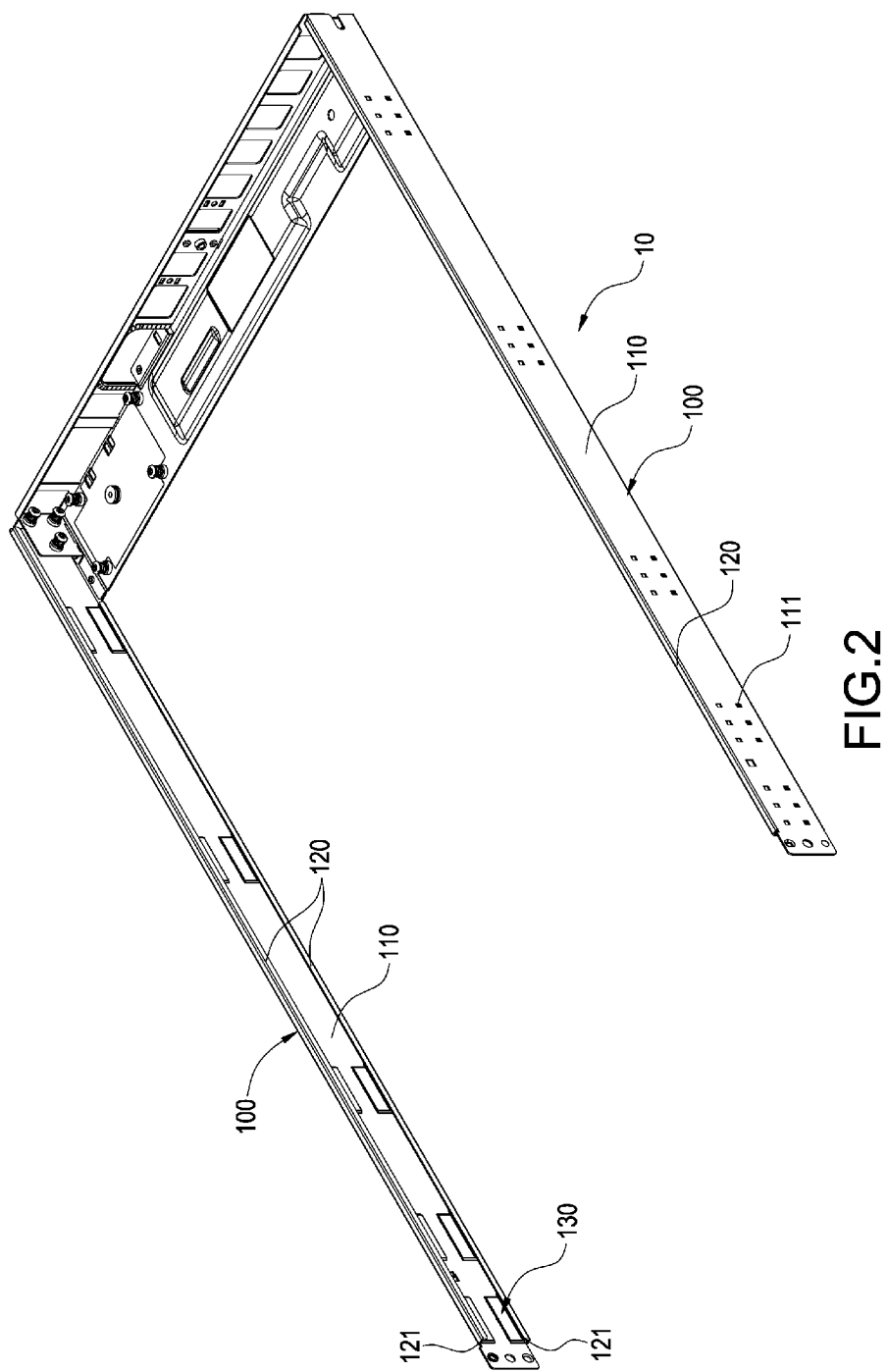
FIG. 2 is a schematic view illustrating the configuration of an outer rail in the server chassis rail according to the preferable embodiment of the present invention.
Figure 3:
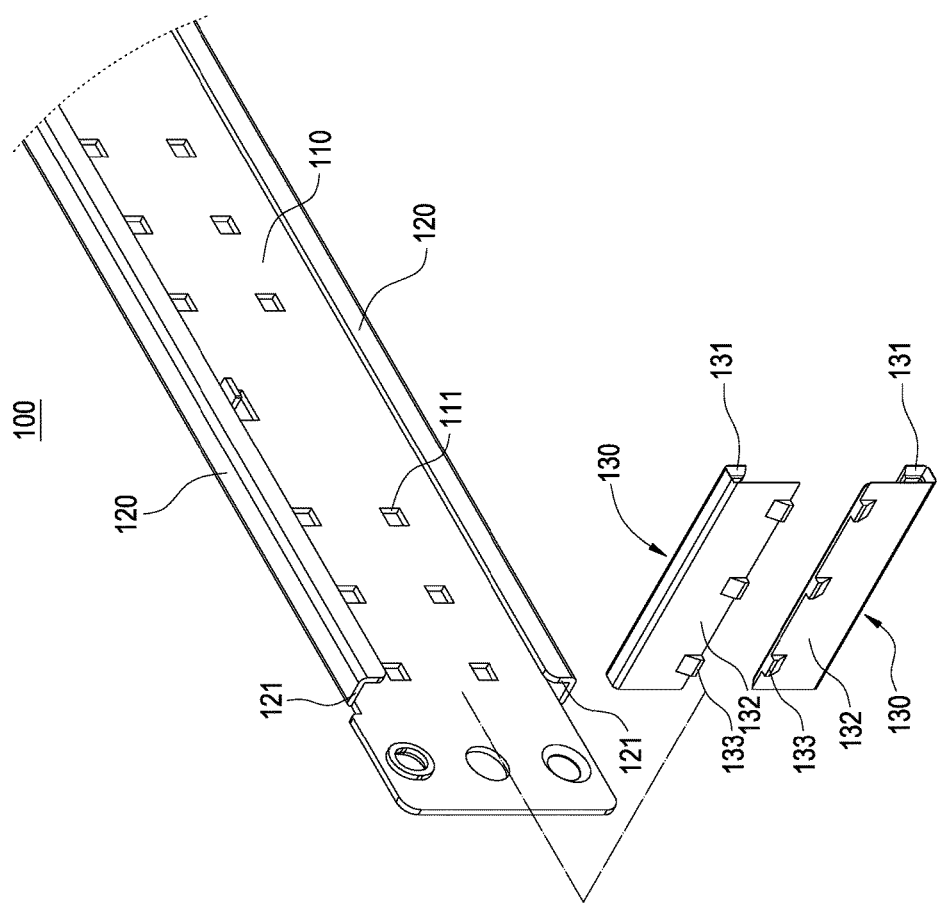
FIG. 3 is a partial exploded view illustrating the outer rail in the server chassis rail according to the preferable embodiment of the present invention.
Figure 4:
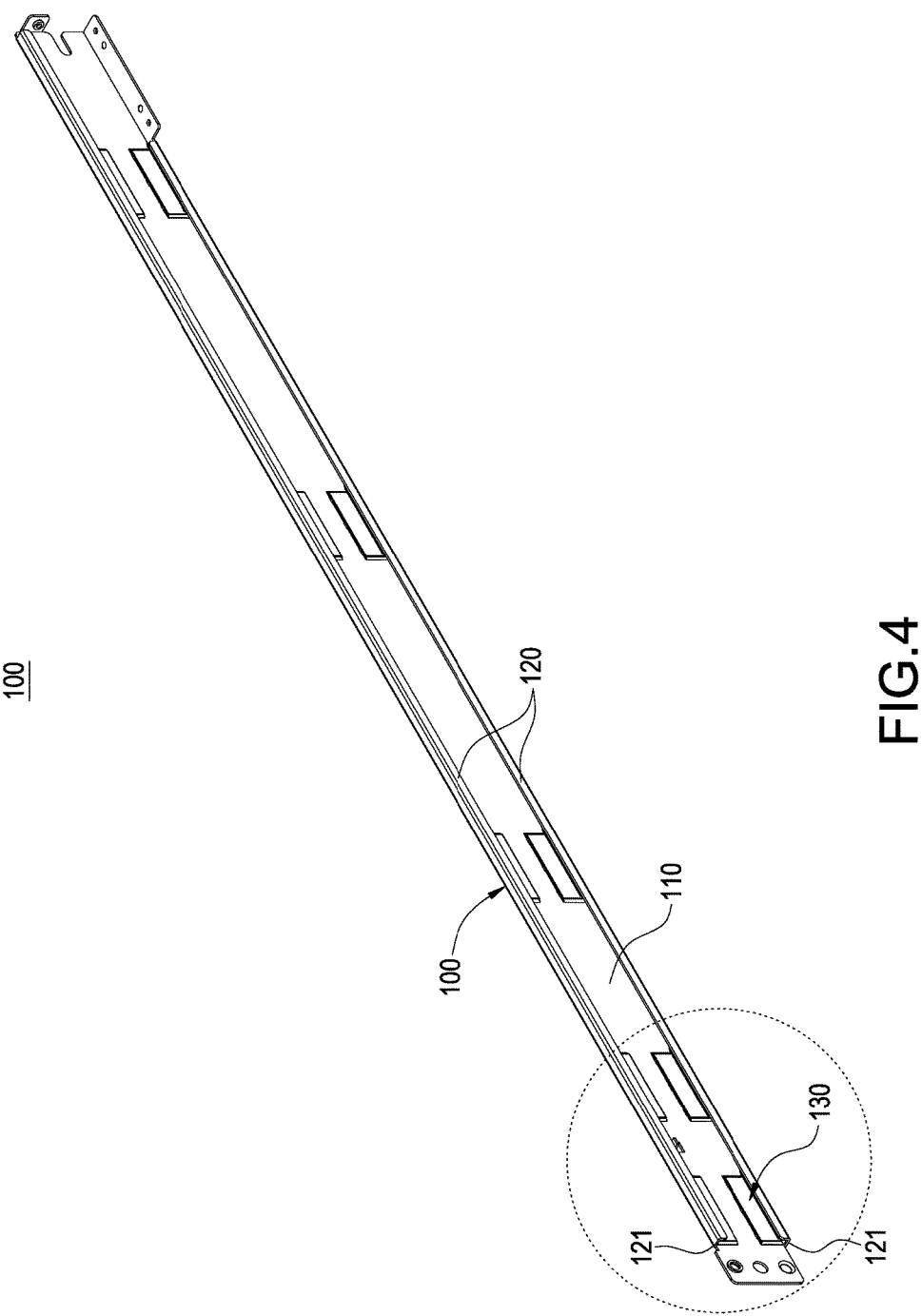
FIG. 4 is a perspective view illustrating the outer rail in the server chassis rail according to the preferable embodiment of the present invention.
Figure 5:
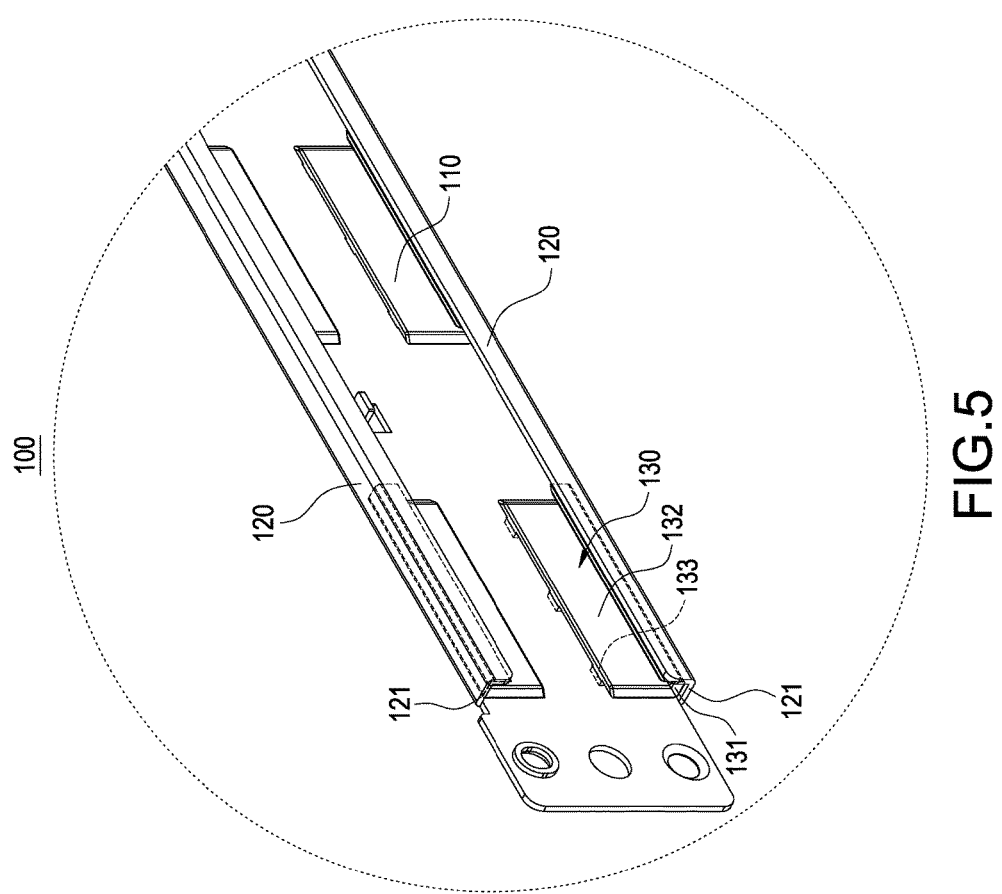
FIG. 5 is a partial enlarged view of FIG. 4.
Figure 9:
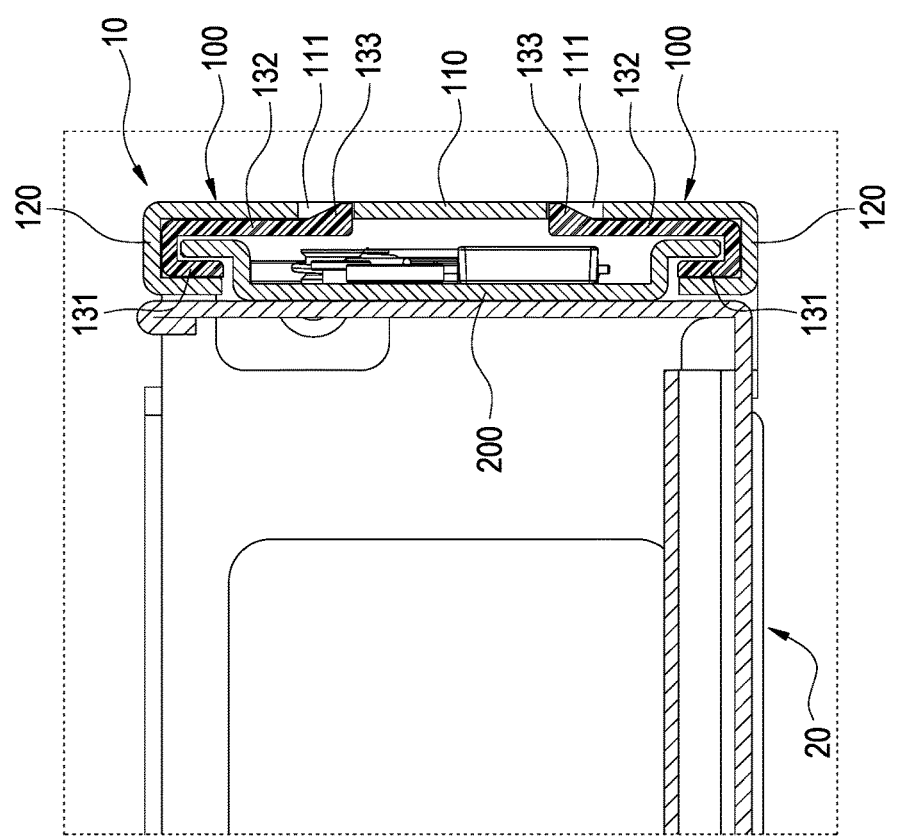
FIG. 9 is a partial enlarged view of FIG. 8.

Referring to FIG. 1, a server chassis rail 10 is provided according to a preferable embodiment of the present invention. The server chassis rail 10 is placed in an inner side of a server cabinet (not illustrated) or a server chassis (not illustrated) for connecting a drawer 20, so that the drawer 20 can be pulled out easily from the server cabinet or the server chassis. The server chassis rail 10 of the present invention includes an outer rail 100 and an inner rail 200 corresponding to the outer rail 100. Normally, two sides of the drawer 20 have a pair of the same server chassis rails 10.

Referring to FIGS. 2 to 7, the outer rail 100 includes a guide plate 110, and the guide plate 110 is a metal plate of a strip shape. Edges at two sides of the guide plate 110 extend to form two troughs 120 arranged opposite to each other in parallel and spaced apart relationship. The trough 120 is preferably formed by bending the edges at the two sides of the guide plate 110, by sheet metal working methods. At least one slide sleeve 130, made of plastic, is disposed in each of the two opposing troughs 120. In the present embodiment, there are multiple slide sleeves 130 disposed in each trough 120. The slide sleeves 130 in the two troughs 120 are disposed in aligned and opposing relationship with respect to each other. The slide sleeve 130 is made of plastic, and each of the slide sleeves 130 forms a recess portion 131, and each of the recess portions 131 is attached to an inner surface of the corresponding trough 120, so each of the recess portions 131 protrudes from the inner surface of the corresponding trough 120. Each of the slide sleeves 130 includes a positioning plate 132 extending from the recess portion 131, and an engagement latch 133 is formed on the positioning plate 132. In the present embodiment, there are preferably multiple engagement latches 133 formed on a distal edge of each positioning plate 132. The guide plate 110 includes a fastening hole 111 corresponding to the engagement latch 133. In the present embodiment, the guide plate 110 includes multiple fastening holes 111, and each fastening hole 111 corresponding to each engagement latch 133. When assembling, an operator places the recess portion 131 into the corresponding trough 120, then pressing the positioning plate 132 to engage each engagement latch 133 in the corresponding fastening hole 111. Moreover, the engagement latches 133 on the two slide sleeves 130 are aligned with each other, so that the slide sleeve 130 can be easily assembled to the outer rail 120. In the present embodiment, one end of each of the troughs 120 is an outer end 121, and the two outer ends 121 of the two troughs 120 are arranged opposite to each other, and a distance between the slide sleeve 130 at the outer end 121 of each trough 12 and the adjacent slide sleeve 130 is less than a distance between any adjacent two of other slide sleeves 130.

Referring to FIGS. 1, 2, 8 and 9, the inner rail 200 is inserted in the corresponding outer rail 100, and each inner rail 200 can move out from one end of the corresponding outer rail 100. It is preferable that, the inner rail 200 can pass through the outer end 121 of the trough 120 to be moved out of the outer rail 100. When the inner rail 200 moves out of the outer rail 100 to a farthest point of movement, the weight of the hard disks in the drawer 20 produces an extremely large torque to the outer end 121 of the trough 120 via the inner rail 200. By means of the two adjacent slide sleeves 130 at the outer end 121 of the trough 120, the inner rail 200 obtains a larger support force against the torque. An edge of each of two sides of the inner rail 200 is inserted in the respective corresponding one of the two recess portions 131, without contacting the inner surface of the trough 120 of the outer rail 100. Since plastic provides a smaller surface frictional force than metal, the inner rail 200 can slide easily with respect to the outer rail 100. By means of the plastic slide sleeve 130, the inner rail 200 easily slides with respect to the outer rail 100, so there is no need to install large-size and expensive rollers in the outer rail 100, thereby reducing costs and facilitating easy assembly.

It is to be understood that the above descriptions are merely the preferable embodiment of the present invention and are not intended to limit the scope of the present invention. Equivalent changes and modifications made in the spirit of the present invention are regarded as falling within the scope of the present invention.

What is claimed is:

1. A server chassis rail, comprising:
    a guide plate, the guide plate being of a strip shape, two sides of the guide plate being disposed with two troughs arranged opposite to each other in parallel and spaced apart relationship, and
    a plurality of slide sleeves, the slide sleeves consisting of plastic, the slide sleeves being disposed in the two opposing troughs, each of the slide sleeves protruding from an inner surface of the corresponding trough,
    wherein each of the slide sleeves forms a recess portion, and each of the recess portions is attached to the inner surface of the corresponding trough;
    wherein each of the slide sleeves includes a positioning plate extending from the recess portion, and each of the positioning plate is attached to the guide plate.

2. The server chassis rail of claim 1, wherein each of the slide sleeves includes an engagement latch, and the engagement latch is engaged with the guide plate.

3. The server chassis rail of claim 1, wherein an engagement latch is formed on the positioning plate, and the engagement latch is engaged with the guide plate.

4. The server chassis rail of claim 3, wherein the guide plate includes a fastening hole corresponding to the engagement latch, and the engagement latch is engaged in the fastening hole.

5. The server chassis rail of claim 3, wherein the engagement latch is formed at a distal edge of the positioning plate.

6. The server chassis rail of claim 5, wherein the slide sleeves in the two troughs are disposed in aligned and opposing relationship with respect to each other, and the engagement latch of each of the slide sleeves is aligned with the engagement latch of the aligned and opposing one of other slide sleeves.

7. The server chassis rail of claim 1, further comprising an inner rail, the inner rail being of a strip shape, a lateral edge of the inner rail being inserted in the at least one slide sleeve in one of the troughs, the other lateral edge of the inner rail being inserted in the at least one slide sleeve in the other trough.

8. The server chassis rail of claim 7, wherein each of the troughs includes an outer end, the two outer ends of the two troughs are arranged opposite to each other, the inner rail passes through the two outer ends of the two troughs to move out, and a distance between the slide sleeve at the outer end and the adjacent slide sleeve is less than a distance between any adjacent two of other slide sleeves.

9. The server chassis rail of claim 1, wherein a distance between the slide sleeve disposed on one end of each of the troughs and the adjacent slide sleeve is less than a distance between any adjacent two of other slide sleeves.

* * * * *